(12) United States Patent
Lee

(10) Patent No.: US 8,837,215 B2
(45) Date of Patent: Sep. 16, 2014

(54) OPERATING METHOD AND DATA READ METHOD IN NONVOLATILE MEMORY DEVICE

(71) Applicant: Samsung Electronics Co., Ltd., Suwon-si (KR)

(72) Inventor: Chul-Ho Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 44 days.

(21) Appl. No.: 13/733,328

(22) Filed: Jan. 3, 2013

(65) Prior Publication Data
US 2013/0194883 A1  Aug. 1, 2013

(30) Foreign Application Priority Data
Jan. 30, 2012  (KR) ........................ 10-2012-0008824

(51) Int. Cl.
G11C 11/34   (2006.01)
G11C 11/56   (2006.01)
G11C 16/26   (2006.01)
G11C 29/04   (2006.01)
G11C 16/10   (2006.01)
G11C 16/34   (2006.01)

(52) U.S. Cl.
CPC ............ G11C 29/04 (2013.01); G11C 11/5642 (2013.01); G11C 16/26 (2013.01); G11C 11/5628 (2013.01); G11C 16/3418 (2013.01); G11C 16/10 (2013.01)
USPC ............ 365/185.03; 365/185.09; 365/185.12; 365/185.18; 365/185.22; 365/185.24; 365/185.29; 365/185.33

(58) Field of Classification Search
USPC ............ 365/185.03, 185.09, 185.12, 185.18, 365/185.22, 185.24, 185.29, 185.33
See application file for complete search history.

(56) References Cited

U.S. PATENT DOCUMENTS

| 6,972,917 | B2 | 12/2005 | Maeda et al. |
| 7,177,989 | B1 | 2/2007 | McGinnis |
| 7,590,884 | B2 | 9/2009 | Daikokuya et al. |
| 8,107,295 | B2 * | 1/2012 | Lee et al. ................ 365/185.18 |
| 8,473,668 | B2 * | 6/2013 | Kim et al. ................ 365/185.09 |
| 2005/0201236 | A1 | 9/2005 | Jun |
| 2006/0221476 | A1 | 10/2006 | Ueno |
| 2007/0064543 | A1 | 3/2007 | Iwasaki |
| 2007/0091677 | A1 | 4/2007 | Lasser et al. |
| 2008/0192541 | A1 | 8/2008 | Kang et al. |
| 2009/0049364 | A1 | 2/2009 | Jo et al. |
| 2009/0190246 | A1 | 7/2009 | Cho et al. |
| 2011/0044101 | A1 | 2/2011 | Chou et al. |
| 2011/0113284 | A1 | 5/2011 | Park et al. |

FOREIGN PATENT DOCUMENTS

| KR | 1020090017844 A | 2/2009 |
| KR | 1020100106111 A | 1/2010 |

OTHER PUBLICATIONS

Choi et al., Jun. 25, 2009, Patent Application Publication US 2009/0164710 A1 (SN 12/340,846).*

* cited by examiner

Primary Examiner — Trong Phan
(74) Attorney, Agent, or Firm — Volentine & Whitt, PLLC

(57) ABSTRACT

In a method of reading data in a nonvolatile memory device including data cells and monitoring cells. A first read operation applies a first read voltage to the data cells and monitoring cells. If a read fail occurs, a second read operation is performed using a read voltage level determined according to a number of ON-cells among the monitoring cells.

20 Claims, 10 Drawing Sheets

OPERATING METHOD AND DATA READ METHOD IN NONVOLATILE MEMORY DEVICE

CROSS-REFERENCE TO RELATED APPLICATIONS

This U.S. non-provisional application claims the benefit of priority under 35 U.S.C. §119 to Korean Patent Application No. 2012-0008824 filed Jan. 30, 2012, the subject matter of which is hereby incorporated by reference.

BACKGROUND

The inventive concept relates generally to nonvolatile memory devices. More particularly, the inventive concept relates to operating methods and data read methods in nonvolatile memory devices.

The individual memory cells in a nonvolatile memory device, such as a flash memory device, store data in accordance with a plurality of threshold voltage distributions, where each respective threshold voltage distribution is assigned a corresponding logic state for stored data. The data stored by a memory cell may then be read by determining whether the memory cell is turned ON/OFF when a predetermined read voltage is applied.

During (and/or following) the programming of a memory cell, its intended threshold voltage distribution may be undesirably shifted or broadened due to a number of events or conditions including (e.g.,) charge leakage, program disturbances, word and/or bit line coupling, temperature change, voltage change, etc. Once the threshold voltage distribution of a memory cell has been thus altered, it become difficult accurately read the logic state of the stored data. In some instances, the logic state becomes indiscernible and a read fail occurs. Once a read fail occurs, conventional nonvolatile memory devices may perform a so-called "read retry operation". One example of a read retry operation is disclosed, for example, in published U.S. Patent Application No. 2010/0322007, the subject matter of which is hereby incorporated by reference.

In general during the read retry, a nonvolatile memory device may iteratively perform a read operation. During each successive iteration of the read operation the level of the applied read voltage is sequentially increased or decreased until the read operation does not result in a read fail. However, the use of repeated read operations during a read retry operation invariably extends the time required to successfully read data from the nonvolatile memory device.

SUMMARY

Certain embodiments of the inventive concept provide operating methods and/or data read methods in nonvolatile memory devices that are capable of accurately reading the data using at most a single read retry operation.

According to certain embodiments of the inventive concept, a data read method in a nonvolatile memory device including data cells and monitoring cells comprises; performing a first read operation by applying a first read voltage having a first read voltage level to the data cells and the monitoring cells, wherein the data cells have been programmed to store data according to a plurality of data state threshold voltage distributions, and the monitoring cells have been programmed to a plurality of predetermined threshold voltages, determining whether a read fail occurs as a result of the first read operation, if the read fail occurs as the result of the first read operation, determining a second read voltage having a second read voltage level determined by adjusting the first read voltage level according to at least one of a number of ON-cells and a number of OFF-cells among the monitoring cells, and then performing a second read operation by applying the second read voltage to the data cells.

According to certain embodiments of the inventive concept, a method of operating a memory system providing error correction capabilities and including a memory controller that controls a nonvolatile memory device, the nonvolatile memory device including data cells and monitoring cells, the method comprises: during a program operation and using a same program voltage, programming the data cells according to a plurality of data state threshold voltage distributions and programming the monitoring cells according to a plurality of predetermined threshold voltages different from the plurality of data state threshold voltage distributions, and then performing a first read operation using a first read voltage having a first read voltage level to obtain read data detected in accordance with the plurality of data state threshold voltage distributions from the data cells, and to obtain monitoring data from the monitoring cells in accordance with the plurality of predetermined threshold voltages, wherein the monitoring data indicates in relation to the first read voltage at least one of a number of ON-cells and a number of OFF-cells among the monitoring cells, determining according to the error correction capabilities of the memory system whether or not the read data is correctable, and only if the read data is not correctable, performing a second read operation using a second read voltage having a second read voltage level that varies from the first read voltage level according to the monitoring data.

According to certain embodiments of the inventive concept, a data read method in a nonvolatile memory device including data cells and monitoring cells, comprises; performing a first read operation by applying a first read voltage having a first read voltage level to the data cells and the monitoring cells, the data cells having been programmed according to a plurality of data state threshold voltage distributions, and the monitoring cells having been programmed according to a plurality of predetermined threshold voltages different from the plurality of data state threshold voltage distributions, if a read fail occurs as a result of the first read operation, determining a second read voltage having a second read voltage level determined by adjusting the first read voltage level according to at least one of a number of ON-cells and a number of OFF-cells among the monitoring cells, and then performing a second read operation using the second read voltage.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Various example embodiments of the inventive concept will now be described in some additional detail with reference to the accompanying drawings. The inventive concept may, however, be embodied in many different forms and should not be construed as being limited to only the illustrated embodiments. Throughout the written description and drawings, like elements and features are denoted by like reference numbers and labels.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
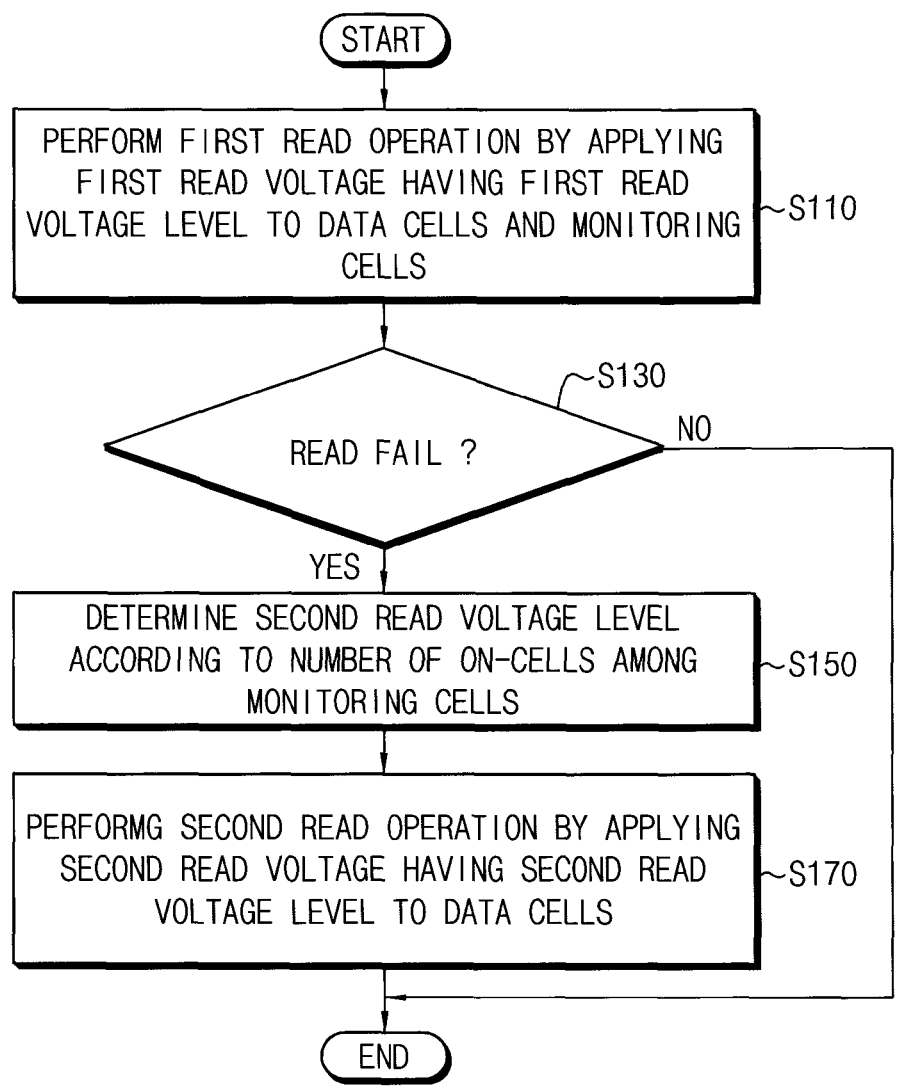
FIG. 1 is a flowchart summarizing a data read method in a nonvolatile memory device according to an embodiment of the inventive concept.

FIG. 1 is a flowchart summarizing a data read method in a nonvolatile memory device according to an embodiment of the inventive concept.

It is assumed that a nonvolatile memory device is configured with both "data cells" intended to store data (e.g., user data and/or corresponding parity data) according to a defined plurality of "data state threshold voltage distributions", and "monitoring cells" that may be programmed to a defined plurality of "predetermined threshold voltages" that are not the same as the plurality of data state threshold voltage distributions. The data cells and/or monitoring cells may be single level cells (SLC) that store one bit of data per memory cell, or multi-level cells (MLC) that store more than one bit of data per memory cell. The data cells and monitoring cells may be commonly coupled to a word line. In certain embodiments, the monitoring cells may be programmed using the same program voltage and type of programming operation used to program data to the data cells. In such embodiments, no additional program voltage or programming operation is required to program the monitoring cells, and overall program time need not be increased on account of the monitoring cells.

In certain embodiments of the inventive concept, the monitoring cells are programmed to have a different threshold voltages that are evenly distributed across a defined range at regular intervals. That is, the monitoring cells need not be specifically programmed to only those threshold voltage distributions used to program the data cells to particular data logic states.

For example, it is assumed that the program voltage used to program the data cells and monitoring cells is an incremental step pulse program (ISPP) voltage. Under this assumption, the ISPP voltage may be applied a number of times to respectively monitoring cells in a set of monitoring cells. As a result, each monitoring cell in the set of monitoring cells will have a threshold voltage distribution that is defined according to the number of ISPP voltage applications in an evenly distributed manner across a defined range. For example, the ISPP voltage may be applied once to a first monitoring cell, twice to a second monitoring cell, . . . , and N times to an N-th monitoring cell in a set of N monitoring cells. This approach to the application of the ISPP voltage will result in a range of evenly distributed threshold voltages across the set of monitoring cells. In certain embodiments, following application of the ISPP voltage to the data cells and the monitoring cells, the threshold voltages of the data cells may be verified to have voltage levels higher than predetermined verify voltage levels, while the threshold voltages of the monitoring cells may not be verified.

Referring to FIG. 1, a first read operation is performed by applying a first read voltage having a first read voltage level to the data cells and the monitoring cells (S110). If the first read voltage is applied to the data cells and the monitoring cells, it may be determined whether each of the data cells and the monitoring cells is an ON-cell having a threshold voltage lower than the first read voltage or an OFF-cell having a threshold voltage higher than the first read voltage. That is, as a result of the first read operation, data may be read from the data cells, and "monitoring cell data" (i.e., a number of monitoring cells being ON-cells or OFF-cells) may be read from the monitoring cells. Hereinafter, for purposes or brevity, certain data read methods will be described in the context of a number of ON-cells among the monitoring cells. However, those skilled in the art will recognize that a number of OFF-cells among the monitoring cells might alternately or additionally be used in other embodiments.

Before the first read operation, the data cells will have been programmed to have one of a plurality of defined threshold voltage distributions that respectively represent different data logic states. Hence, the first read operation will normally read the data logic states for the data cells. While (or after) the data cells are programmed to have one of "the plurality of data logic state threshold voltage distributions" (e.g., respective threshold voltage distributions for a 2-bit nonvolatile memory cell that correspond to data values of 00, 01, 10, and 11), said threshold voltage distribution may be shifted due to one or more of certain well understood events or effects (e.g., charge leakage, program disturb, coupling, temperature change, voltage change, etc.).

Bearing this possibility in mind, the outcome of the first read operation may or may not be a read fail. Accordingly, a determination is now made as to whether a read fail has occurred as the result of the first read operation (S130). In certain embodiments, whether the read fail has occurred may be determined by a memory controller that controls the nonvolatile memory device in a memory system. For example, the nonvolatile memory device may provide the memory controller with results of the first read operation including the detected data and detected monitoring cell data. That is, assuming that the detected data includes both user data and corresponding parity, the memory controller may determine whether the user data is correctable or uncorrectable in view of the error correction capabilities of the memory system.

Where the user data is determined to be uncorrectable, the memory controller may indicate that a read fail has occurred and further generate read fail control information. In certain embodiments, the read fail indication (including possibly read fail information) will be communicated to the nonvolatile memory device. For example, a read level setting unit included in the nonvolatile memory device may be used to determine whether the number of ON-cells among the monitoring cells exceeds a predetermined threshold. Where the number of ON-cells among the monitoring cells increased or decreased by at least a predetermined value, the read level setting unit may determine that a read fail has occurred.

If a read fail has not occurred as the result of the first read operation (S130=NO), the reading of data from the data cells may be successfully completed, since the read data stored in the data cells either contains no bit errors, or a number of bit errors within the error correction capabilities of the memory system.

However, if a read fail occurred as a result of the first read operation (S130=YES), a second read voltage level is performed in accordance with a number of ON-cells among the monitoring cells (S150). A second read voltage having a second level different from the first level of the first read voltage may in certain embodiments of the inventive concept be determined in linear inverse proportion to the number of ON-cells among the monitoring cells. That is, the second read voltage level may be determined such that an increment/decrement from the first read voltage level to the second read voltage level will be in linear inverse proportion to an increment/decrement in the number of the ON-cells.

For example, the monitoring cells are assumed to have been previously programmed to have the evenly distributed set of threshold voltages over a range as defined by a predetermined voltage interval. Thus, the second read voltage level may be determined to increase or decrease by a multiple of a "predetermined voltage interval" from the first read voltage level according to the number of ON-cells among the monitoring cells. In a case where the number of ON-cells increases by one, the second read voltage level may be determined to decrease by one predetermined voltage interval from the first read voltage level. In another case where the number of ON-cells increases by two, the second read voltage level may be determined to decrease by two predetermined voltage intervals from the first read voltage level. In still another case where the number of ON-cells decreases by one, the second read voltage level may be determined to increase by one predetermined voltage interval from the first read voltage level. In still another case where the number of ON-cells decreases by two, the second read voltage level may be determined to increase by two predetermined voltage intervals from the first read voltage level.

In certain embodiments, the second read voltage level may be determined by operation of the memory controller. For example, the memory controller may count the number of the ON-cells among the monitoring cells based on the monitoring cell data provided from the nonvolatile memory device, and then determine the second read voltage level as an applied increment/decrement from the first read voltage level to define the second read voltage level in linear inverse proportion to the increment/decrement in the number of the ON-cells. The memory controller may then communicate an appropriate second read voltage level to the nonvolatile memory device by (e.g.,) providing the nonvolatile memory device with a read level setting command.

In other embodiments, the second read voltage level may be determined by the read level setting unit included in the nonvolatile memory device. For example the read level setting unit may count the number of the ON-cells among the monitoring cells based on the monitoring cell data read from the monitoring cells, and then determine an appropriate second read voltage level such that the increment/decrement from the first read voltage level to the second read voltage level is in linear inverse proportion to the increment/decrement of the number of the ON-cells.

A second read operation may then be performed in accordance with the second read voltage having a level different from the first read voltage (S170). Since the second read voltage level has been optimally defined in view of a threshold voltage shift ascribed to the monitoring cells and corresponding to the threshold voltage shift of the data cells, the data read by the second read operation will be accurate.

As described above, in a data read method in a nonvolatile memory device according to embodiments of the inventive concept, monitoring cell data (i.e., data representing a number of ON-cells among the monitoring cells) may be obtained by the first read operation. Then, without need to repeatedly and iteratively perform multiple additional read operations, an optimal read voltage level may be determined according to the monitoring cell data. Thus, although a read fail occurs as the result of a first read operation, data may nonetheless be accurately read in what amounts to a single read retry (or alternately expressed as the result of at most two read operations). Accordingly, as compared with conventional read methods potentially including multiple read retry operations to determine an optimal read voltage level, data read methods according to embodiments of the inventive concept provide accurately read data with markedly reduced read times. Further, since the monitoring cell data may be obtained during the first read operation, no additional operations uniquely associated with obtaining the monitoring cell data are required. In addition, since the monitoring cells may be programmed using a range of predetermined threshold voltages while the data cells are being programmed, no additional operations uniquely associated with programming the monitoring cell data are required, thereby reducing overall programming time.

In certain embodiment, at least one page included in each memory block of a memory cell array within the nonvolatile memory device may include monitoring cells. In other embodiments, every page included in each memory block may include monitoring cells. In this case, the monitoring cells in each page may be programmed to have the predetermined threshold voltages when the page is programmed, and the monitoring cell data may be read from the monitoring cells of each page when the page is read. If a read fail occurs when a particular page is read, then an optimal read voltage level for the page may be immediately determined according to the number of ON-cells among the monitoring cells of the page.

In still other embodiments, a particular page (e.g., page 0) included in each memory block of the nonvolatile memory device may include monitoring cells. In this case, the monitoring cells of the particular page may be programmed to have the predetermined threshold voltages when the particular page is programmed, and the monitoring cell data may be read from the monitoring cells of the particular page when the particular page is read. If a read fail occurs when the particular page is read, an optimal read voltage level for a memory block including the particular page may be determined according to the number of ON-cells among the monitoring cells of the particular page. Thereafter, the determined optimal read voltage level may be used when other pages of the memory block including the particular page are read.

Figure 2A:
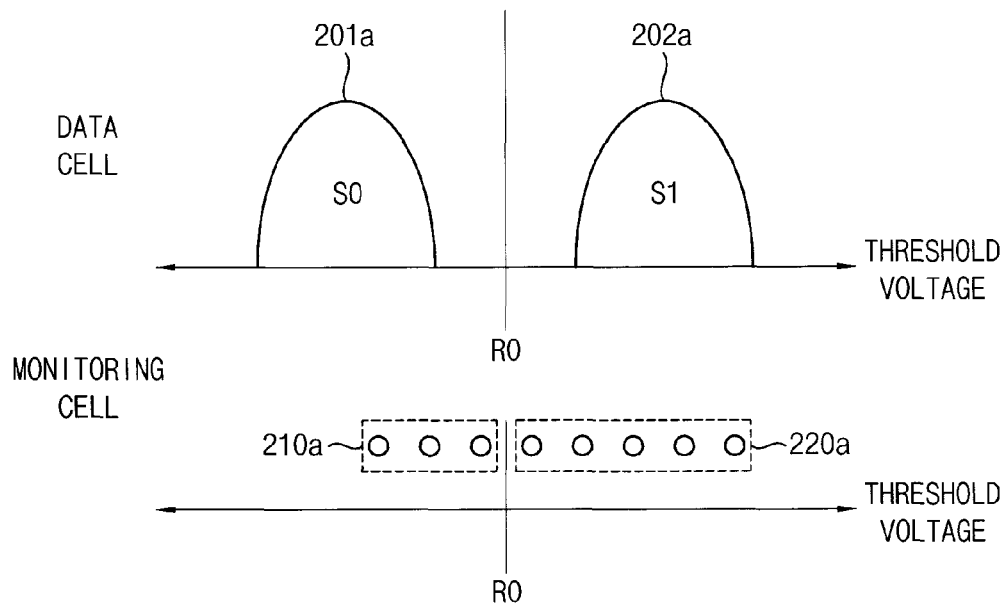
FIGS. 2A and 2B are diagrams illustrating examples of threshold voltage distributions for data cells and monitoring cells.
Figure 2B:
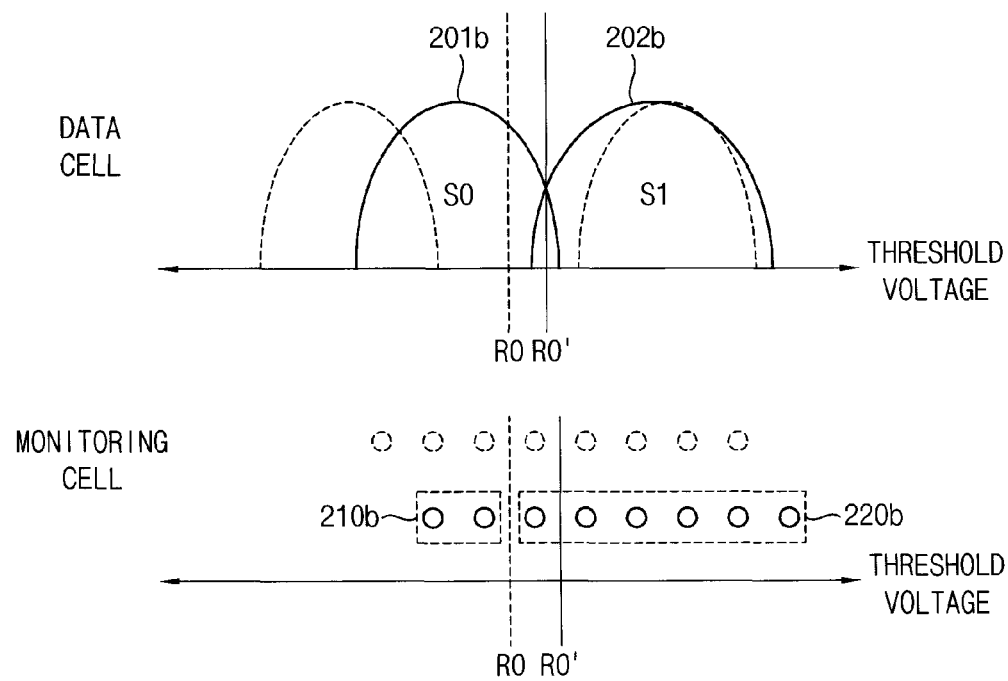
Figure 4A:
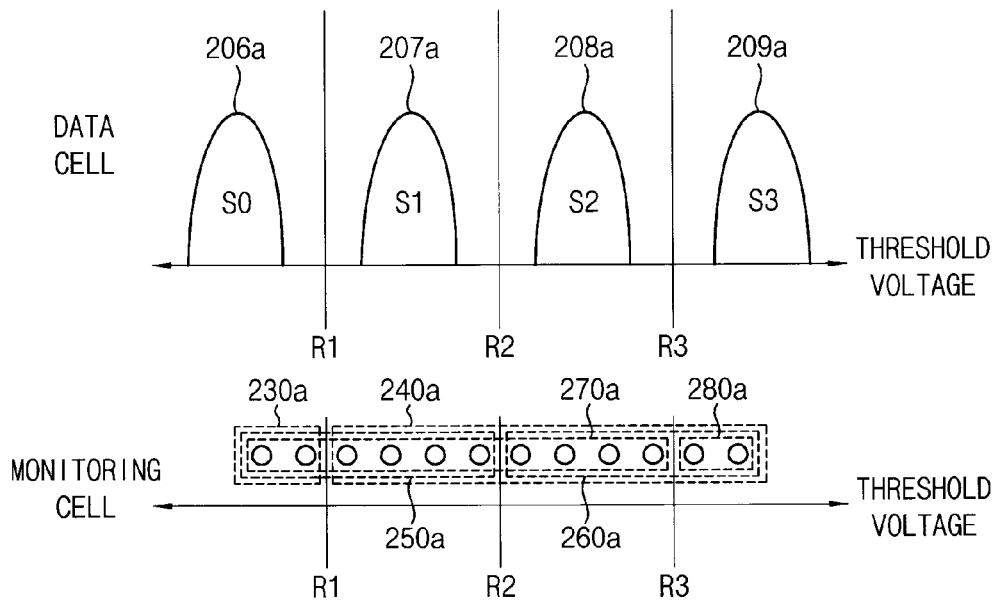
FIGS. 4A and 4B are diagrams illustrating examples of threshold voltage distributions for data cells and monitoring cells.
Figure 4B:
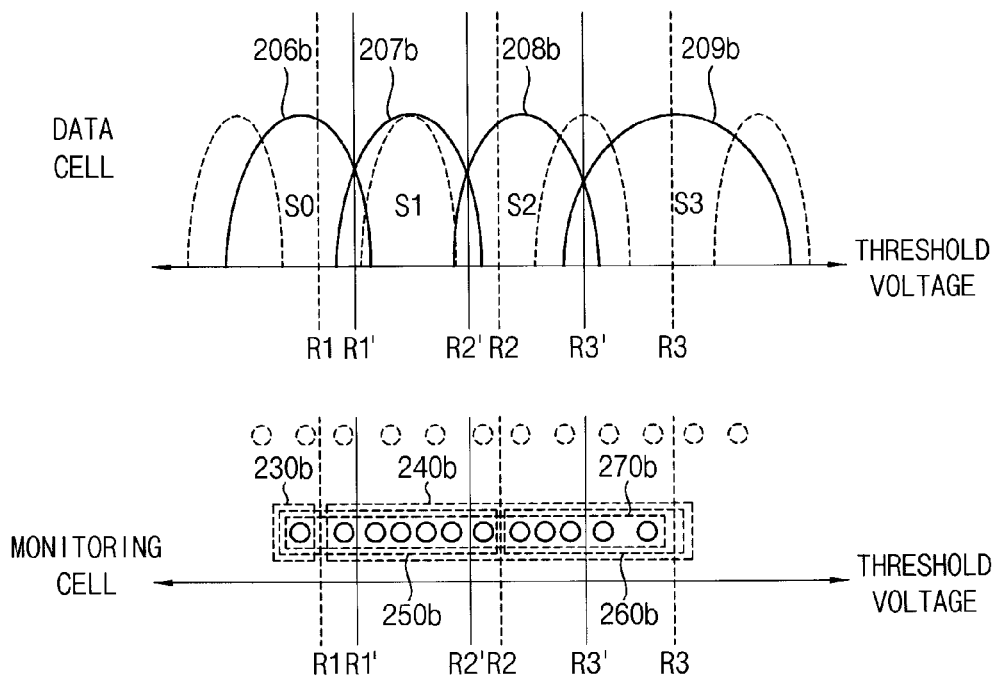

According to certain embodiments including data cells configured from MLC, each one of a plurality of second read voltage levels may be respectively determined according to a number of ON-cells among the monitoring cells in response to multiple first read operations. FIGS. 2A and 2B illustrate examples wherein data cells are SLC. FIGS. 4A and 4B illustrate examples where data cells are MLC.

Figure 3:
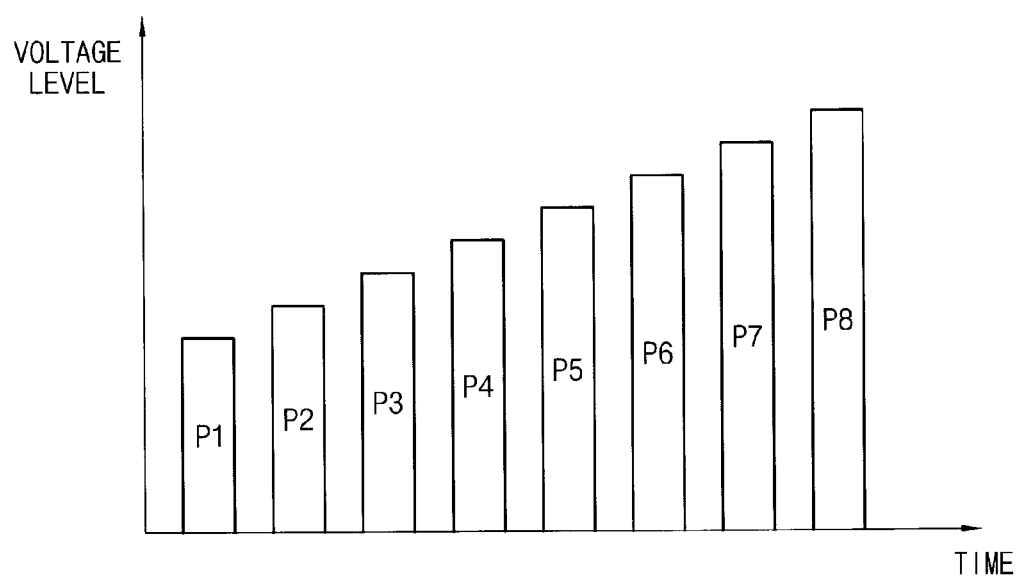
FIG. 3 is a diagram illustrating an example of a program voltage that may be used to program data cells and monitoring cells.

FIGS. 2A and 2B are diagrams illustrating examples of threshold voltage distributions for 1-bit SLC data cells and monitoring cells. FIG. 3 is a diagram illustrating one possible example of a program voltage (an incrementing eight-step (P1-P8) ISSP voltage) that may be used to program the data cells and monitoring cells.

FIG. 2A illustrates threshold voltage distributions 201a and 202a for data cells and monitoring cells where no significant threshold voltage shift has occurred during or after programming of the data cells. In contrast, FIG. 2B illustrates threshold voltage distributions 201b and 202b for the data cells and monitoring cells where a threshold voltage shift has occurred.

Referring to FIG. 2A, the data cells are SLC and may be programmed to have one of a first state (e.g., an erase state) S0 or a second state (e.g., a program state) S1. A first threshold voltage distribution 201a corresponding to the first state S0 and is separated from a second threshold voltage distribution 202a corresponding to the second state S1. A first read voltage level R0 may be used to read data from the data cells and is located between the first threshold voltage distribution 201a and the second threshold voltage distribution 202a.

While the data cells are programmed, each monitoring cell may be programmed within a predetermined "monitoring range" of threshold voltages. In certain embodiments, the monitoring cells may be programmed to have different threshold voltages that are evenly distributed at regular intervals over the monitoring range. For example, it is assumed that the data cells and monitoring cells are commonly coupled to a word line, and that the monitoring cells may be programmed using an ISPP voltage applied to the common word line during programming of the data cells. Under these assumptions, a sequentially varying number of ISPP voltage applications to respective monitoring cells will yield a set of monitoring cells having threshold voltages that are evenly distributed across the monitoring range.

For example, referring to the exemplary ISSP voltage of FIG. 3, during the programming of data to the data cells a variable programming voltage defined in accordance with first through eighth program pulses P1, P2, P3, P4, P5, P6, P7 and P8 may be applied to a selected word line connecting the data cells. The eight level-varying versions of the programming voltage (i.e., the ISSP voltage) may also be used to program a set of monitoring cells. For example, each version of the ISSP voltage may be sued to program a corresponding one of the monitoring cells in the set of monitoring cells. That is, a number of applications for the first through eighth program pulses P1, P2, P3, P4, P5, P6, P7 and P8 to the monitoring cells may be sequentially increased for the respective monitoring cells. For example, a first monitoring cell may receive only the first program pulse P1, and a program inhibit voltage may be applied to a bitline coupled to the first monitoring cell when the second through eighth program pulses P2, P3, P4, P5, P6, P7 and P8 are applied to the same wordline. Thus, the first monitoring cell may not substantially receive the second through eighth program pulses P2, P3, P4, P5, P6, P7 and P8. Further, a second monitoring cell may receive the first and second program pulses P1 and P2, and a third monitoring cell may receive the first through third program pulses P1, P2 and P3. Similarly, an eighth monitoring cell may receive the first through eighth program pulses P1, P2, P3, P4, P5, P6, P7 and P8. Accordingly, the first monitoring cell may have the lowest threshold voltage in the established monitoring range, and the eighth monitoring cell may have the highest threshold voltage in the monitoring range, with the threshold voltages of the first through eighth monitoring cells being substantially separated by a preset interval. As described above, an ISSP voltage may be iteratively applied as a program voltage in each of its incrementally adjusted versions to a set of monitoring cells, thereby the monitoring cells may be programmed to have the different threshold voltages evenly distributed at regular intervals across a defined monitoring range of threshold voltages.

In certain embodiments, after each program pulse is applied to the data cells and the monitoring cells, the threshold voltages of the data cells may be verified to be higher than a verify voltage, while the threshold voltages of the monitoring cells need not be verified.

In data read methods in a nonvolatile memory device according to embodiments of the inventive concept, a first read operation may be performed by applying a first read voltage having the first read voltage level R0 to the data cells and the monitoring cells. Then, it is determined whether a read fail has occurred as a result of the first read operation. If a significant threshold voltage shift for the data cells has not occurred (per FIG. 2A), then a read fail will not occur and the data cells may be normally read using the first read voltage R0.

In the examples of FIGS. 2A and 2B eight (8) monitoring cells are assumed to be included in one page. However, those skilled in the art will recognize that any reasonable number of the monitoring cells may be included in a page (as variable described above) in view of (e.g.,) a number of defined ISPP voltage increments for a program voltage, a number of possible logic states for each memory cells, the number of bits stored per memory cells, etc.).

Referring now to FIG. 2B, while (or after) the data cells and the monitoring cells are programmed, a threshold voltage shift for the data cells and the monitoring cells may occur as the result of a number of events or conditions. For example, the first threshold voltage distribution 201a corresponding to the first state S0 illustrated in FIG. 2A may be changed to a shifted first threshold voltage distribution 201b illustrated in FIG. 2B, and the second threshold voltage distribution 202a corresponding to the second state S1 illustrated in FIG. 2A may be changed to a shifted second threshold voltage distribution 202b illustrated in FIG. 2B. As the result of the threshold voltage shift and as illustrated in FIG. 2B, the shifted first threshold voltage distribution 201b corresponding to the first state S0 and the shifted second threshold voltage distribution 202b corresponding to the second state S1 may overlap, or may not be separated by an adequate sensing margin. Hence, the number of ON-cells among the data cells and monitoring cells in response to the different first threshold voltage distributions 210a and 210b may be different in relation to the first read voltage R0. For example, as the result of the threshold voltage shift, the number of ON-cells for 210b verses 210a may decrease from three (3), as illustrated in FIG. 2A, to two (2), as illustrated in FIG. 2B. Commensurately, the number of OFF-cells for 220b verses 220a increases from five (5), as illustrated in FIG. 2A, to six (6), as illustrated in FIG. 2B.

In the data read method in the nonvolatile memory device according to an embodiment of the inventive concept, the first read operation may be performed by applying the first read voltage having the first read voltage level R0 to the data cells and the monitoring cells. A read fail may occur as the result of the first read operation. In certain embodiments, a memory controller may be sued to determine whether "read data" obtained as a result of the first read operation is correctable using the error correction capabilities of the memory system. In other embodiments, a read level setting unit included in the nonvolatile memory device may be used to determine whether a number of ON-cells 210b (or a number of off-cells 220b) among the monitoring cells exceeds a predetermined threshold in order to determine a read fail occurrence. Where the shifted first threshold voltage distribution 201b corresponding to the first state S0 overlaps the shifted second threshold voltage distribution 202b corresponding to the second state S1, as illustrated in FIG. 2B, a read fail may occur due to the relative misplacement of the first read voltage R0.

Upon determining a read fail has occurred, an appropriately shifted first (or "second") read voltage level R0' may be determined according to the number of ON-cells 210b having threshold voltage levels lower than the first read voltage level R0 among the monitoring cells. For example, the second read voltage level R0' may be determined such that an increment/decrement from the first read voltage level R0 to the second read voltage level R0' is made in linear inverse proportion to an increment/decrement of the number of the ON-cells 210a and 210b. As illustrated in FIG. 2B, in a case where a number of the ON-cells 210a and 210b has decreased by one, the second read voltage level R0' may be determined by increasing (or shifting) the first read voltage R0 by one predetermined voltage interval to properly obtain the second first read voltage level R0' to be used for the second read operation. The predetermined voltage interval may correspond to the interval between the threshold voltages of the monitoring cells illustrated in FIG. 2A where a threshold voltage shift has not occurred. Further, in a case where the number of ON-cells 210a and 210b decreases by two, the second read voltage level R0' may be determined by increasing by two predetermined voltage intervals from the first read voltage level R0. In a case where the number of ON-cells 210a and 210b increases by one, the second read voltage level R0' may be determined to decrease by one predetermined voltage interval from the first read voltage level R0. In a case where the number of ON-cells 210a and 210b increases by two, the second read voltage level R0' may be determined to decrease by two predetermined voltage intervals from the first read voltage level R0.

The nonvolatile memory device may now perform the second read operation using the second (i.e., a shifted first) read voltage having a second read voltage level R0'. Since the second read voltage level R0' is optimally defined based on the threshold voltage shift of the monitoring cells corresponding to the threshold voltage shift of the data cells, the second read operation will be accurate. As described above, in a data read method in a nonvolatile memory device according to embodiments of the inventive concept, data may be accurately read using at most two read operations (e.g., an initial read operation and a single read retry operation).

FIGS. 4A and 4B are diagrams illustrating examples of threshold voltage distributions for data cells and monitoring cells assuming 2-bit MLC.

FIG. 4A illustrates an example of threshold voltage distributions 206a, 207a, 208a and 209a for data cells and monitoring cells where a threshold voltage shift caused by a charge leakage, a program disturb, electrical coupling, a change in temperature, a change in voltage, etc. has bit occurred during or after a program operation. FIG. 4B illustrates an example of threshold voltage distributions 206b, 207b, 208b and 209b for the data cells and monitoring cells where a threshold voltage shift has occurred.

Referring to FIG. 4A, the data cells are MLC capable of being programmed to one of a plurality of state including a first (erase) state S0, a second state S1, a third state S2 or a fourth state S3. While the data cells are programmed, the monitoring cells may be programmed to have different threshold voltages evenly distributed at regular intervals across a predetermined monitoring range of threshold voltages. For example, the monitoring cells may be programmed using an ISPP voltage applied to the programming of the data cells, where a number of iterative ISPP voltage applications to the respective monitoring cells may be used to establish the desired threshold voltages for the monitoring cells. Accordingly, the monitoring cells may be programmed to have the evenly distributed threshold voltages. In certain embodiments, while the data cells and the monitoring cells are programmed, threshold voltages for the data cells may be verified, while the threshold voltages of the monitoring cells are not.

In a data read method in a nonvolatile memory device according to embodiments of the inventive concept, a first read operation may be performed by applying a first read voltage having a first read voltage level R1, a second read voltage having a second read voltage level R2 and a third read voltage having a third read voltage level R3 to the data cells and monitoring cells. It may be determined whether a read fail occurs during the first read operation. If threshold voltage shift for the data cells has not occurred, as illustrated in FIG. 4A, it will be determined that a read fail has not occurred, and the data cells will be normally read. Although FIG. 4A illustrates an example where twelve (12) monitoring cells are included in a page, the number of the monitoring cells included in a page may vary according design.

Referring to FIG. 4B, while or after the data cells and monitoring cells are programmed, a threshold voltage shift for the data cells and monitoring cells occurs. For example the first threshold voltage distribution 206a corresponding to the first state S0 illustrated in FIG. 4A may be changed to a shifted first threshold voltage distribution 206b illustrated in FIG. 4B, the second threshold voltage distribution 207a corresponding to the second state S1 illustrated in FIG. 4A may be changed to a shifted second threshold voltage distribution 207b illustrated in FIG. 4B, the third threshold voltage distribution 208a corresponding to the third state S2 illustrated in FIG. 4A may be changed to a shifted third threshold voltage distribution 208b illustrated in FIG. 4B, and the fourth threshold voltage distribution 209a corresponding to the fourth state S3 illustrated in FIG. 4A may be changed to a shifted fourth threshold voltage distribution 209b illustrated in FIG. 4B.

The number of first ON-cells 230a and 230b having threshold voltage levels lower than the first read voltage level R1 (or the number of first OFF-cells 240a and 240b) among the monitoring cells may be changed by the threshold voltage shift, the number of second ON-cells 250a and 250b having threshold voltage levels lower than the second read voltage level R2 (or the number of second OFF-cells 260a and 260b) among the monitoring cells may be changed by the threshold voltage shift, and the number of third ON-cells 270a and 270b having threshold voltage levels lower than the third read voltage level R3 (or the number of third OFF-cells 280a) among the monitoring cells may be changed by the threshold voltage shift. For example, as the result of the threshold voltage shift, as illustrated in FIGS. 4A and 4B, the number of the first ON-cells 230a and 230b may be decreased from two to one, and the number of the first OFF-cells 240a and 240b may be increased from ten to eleven. The number of the second ON-cells 250a and 250b may be increased from six to seven, and the number of the second OFF-cells 260a and 260b may be decreased from six to five. The number of the third ON-cells 270a and 270b may be increased from ten to twelve, and the number of the third OFF-cells 280a may be decreased from two to zero.

In a data read method in the nonvolatile memory device according to an embodiment of the inventive concept, the first read operation may be performed by applying the first read voltage having the first read voltage level R1, the second read voltage having the second read voltage level R2 and the third read voltage having the third read voltage level R3 to the data cells and the monitoring cells. It may then be determined whether a read fail occurs during the first read operation. As illustrated in FIG. 4B, in a case where at least a portion of the threshold voltage distributions 206b, 207b, 208b and 209 overlap, a read fail may occur as data is inaccurately read.

Upon it is determined that the read fail has occurred, a shifted first read voltage level R1' may be determined according to the number of first ON-cells 230b having the threshold voltage levels lower than the first read voltage level R1 (or the number of the first OFF-cells 240b) among the monitoring cells, a shifted second read voltage level R2' may be determined according to the number of second ON-cells 250b having the threshold voltage levels lower than the second read voltage level R2 (or the number of second OFF-cells 260b) among the monitoring cells, and a shifted third read voltage level R3' may be determined according to the number of third ON-cells 270b having the threshold voltage levels lower than the third read voltage level R3 (or the number of third OFF-cells) among the monitoring cells.

For example, the shifted first (or fourth) read voltage level R1' may be determined such that an increment/decrement from the first read voltage level R1 to the fourth read voltage level R1' may be in linear inverse proportion to an increment/decrement of the number of the first ON-cells 230a and 230b (or in linear proportion to an increment/decrement of the number of the first OFF-cells 240a and 240b), the shifted second (or fifth) read voltage level R2' may be determined such that an increment/decrement from the second read voltage level R2 to the fifth read voltage level R2' may be in linear inverse proportion to an increment/decrement of the number of the second ON-cells 250a and 250b (or in linear proportion to an increment/decrement of the number of the second OFF-cells 260a and 260b), and the shifted third (or sixth) read voltage level R3' may be determined such that an increment/decrement from the third read voltage level R3 to the sixth read voltage level R3' may be in linear inverse proportion to an increment/decrement of the number of the third ON-cells 270a and 270b (or in linear proportion to an increment/decrement of the number of the third OFF-cells 280a).

As illustrated in FIG. 4B, in a case where the number of the first ON-cells 230a and 230b are decreased by one, the fourth read voltage level R1' may be determined to increase by one predetermined voltage interval from the first read voltage level R1. The predetermined voltage interval may correspond to the interval between the threshold voltages of the monitoring cells illustrated in FIG. 4A where the threshold voltage shift does not occur. Further, as illustrated in FIG. 4B, in a case where the number of the second ON-cells 250a and 250b are increased by one, the fifth read voltage level R2' may be determined to decrease by one predetermined voltage interval from the second read voltage level R2. As illustrated in FIG. 4B, in a case where the number of the third ON-cells 270a and 270b are increased by two, the sixth read voltage level R3' may be determined to decrease by two predetermined voltage intervals from the third read voltage level R3. As described above, the fourth through sixth read voltage levels R1', R2' and R3' may be substantially simultaneously determined based on a result of the first read operation.

A nonvolatile memory device according to an embodiment of the inventive concept may then perform a second read operation by applying the fourth read voltage having the fourth read voltage level R1', the fifth read voltage having the fifth read voltage level R2' and the sixth read voltage having the sixth read voltage level R3' to the data cells. Since the fourth through sixth read voltage levels R1', R2' and R3' are optimally determined read voltage levels based on the threshold voltage shift of the monitoring cells corresponding to the threshold voltage shift of the data cells, the data read by the second read operation will be accurate. As described above, in a data read method in the nonvolatile memory device according to an embodiment of the inventive concept, the data may be accurately read essentially using a single read retry.

Although FIGS. 2A and 2B illustrate examples where the data cells are SLC, and FIGS. 4A and 4B illustrate examples where the data cells are 2-bit MLC, other embodiments of the inventive concept may readily be applied to memory systems including 3-bit or higher MLC.

Figure 5:
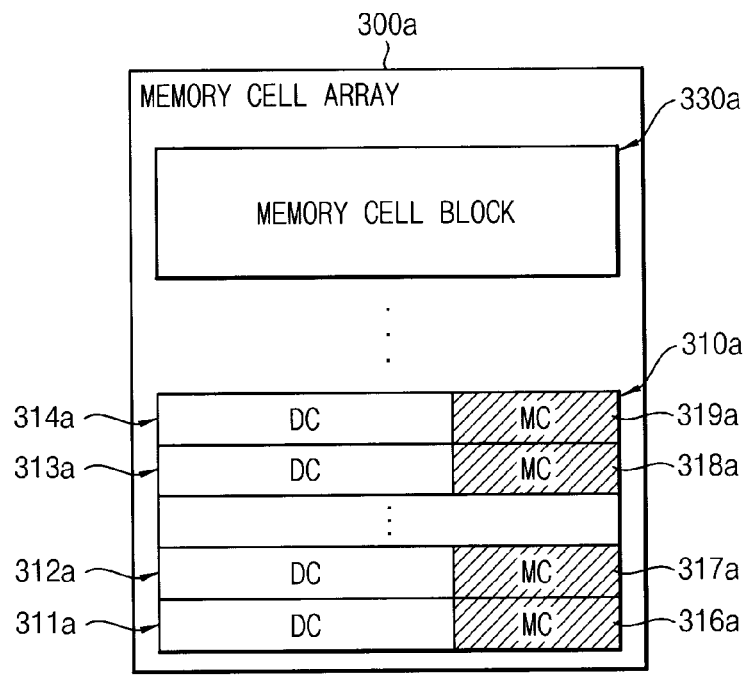
FIG. 5 is a diagram illustrating in part a memory cell array that may be included in a nonvolatile memory device according to an embodiment of the inventive concept.

FIG. 5 is a diagram illustrating a memory cell array that may be included in a nonvolatile memory device according to an embodiment of the inventive concept.

Referring to FIG. 5, a memory cell array 300a includes a plurality of memory cell blocks 310a and 330a. Each memory cell block 310a and 330a may include a plurality of pages 311a, 312a, 313a and 314a.

Each page 311a, 312a, 313a and 314a may include data cells DC storing user data and/or parity bits, and monitoring cells (MC) 316a, 317a, 318a and 319a. For example, a first page 311a may include first monitoring cells 316a, a second page 312a may include second monitoring cells 317a, a third page 313a may include third monitoring cells 318a, and a fourth page 314a may include fourth monitoring cells 319a. The first monitoring cells 316a may be programmed when the data cells DC included in the first page 311a are programmed, the second monitoring cells 317a may be programmed when the data cells DC included in the second page 312a are programmed, the third monitoring cells 318a may be programmed when the data cells DC included in the third page 313a are programmed, and the fourth monitoring cells 319a may be programmed when the data cells DC included in the fourth page 314a are programmed.

During a read operation directed to the data cells DC of the first page 311a, first monitoring cell data representing whether each of the first monitoring cells 316a is an ON-cell or an OFF-cell may be obtained. Further, second monitoring cell data for the second monitoring cells 317a may be obtained by a read operation for the second page 312a, third monitoring cell data for the third monitoring cells 318a may be obtained by a read operation for the third page 313a, and fourth monitoring cell data for the fourth monitoring cells 319a may be obtained by a read operation for the fourth page 314a. If a read fail occurs during the read operation for the first page 311a, a more optimal read voltage level for the first page 311a may be determined according to the number of ON-cells among the first monitoring cells 316a based on the first monitoring cell data, and the read operation for the first page 311a may be retried using the more optimal read voltage level for the first page 311a. Further, if the read fail occurs during the read operation for the second page 312a, the third page 313a or the fourth page 314a, a more optimal read voltage level for the second page 312a, the third page 313a or the fourth page 314a may be determined based on the second monitoring cell data, the third monitoring cell data or the fourth monitoring cell data, respectively.

As described above in relation to FIG. 5, in certain embodiments, each and every page 311a, 312a, 313a and 314a includes monitoring cells 316a, 317a, 318a and 319a. If a read fail occurs during a read operation for a given page, a more optimal read voltage level for the page may be determined according to the number of ON-cells among the monitoring cells included in the page. Then, the read operation for the page may be retried by using the more optimal read voltage level. In this manner a data read method in the nonvolatile memory device according to an embodiment of the inventive concept will accurately read stored data using at most two read operation (e.g., an initial read operation and perhaps a single read retry operation).

Figure 6:
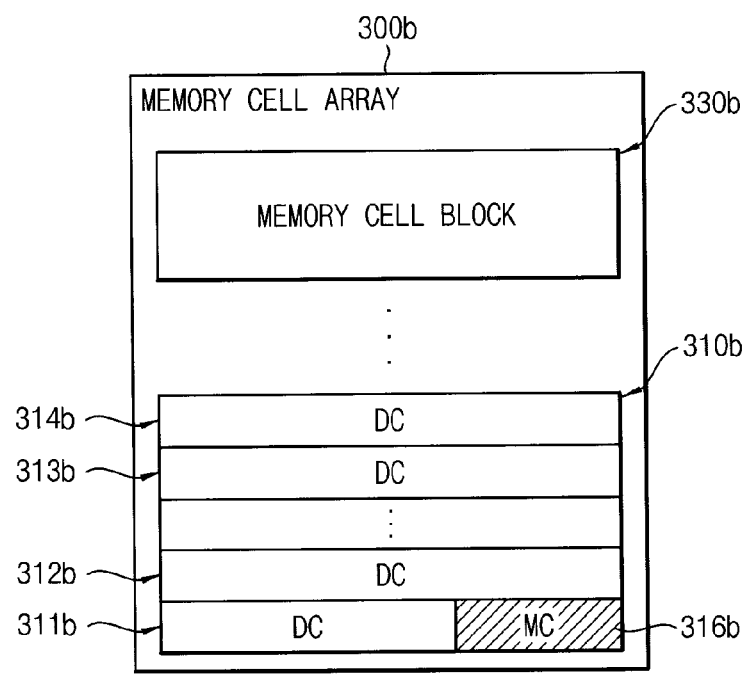
FIG. 6 is a diagram illustrating in part a memory cell array that may be included in a nonvolatile memory device according to an embodiment of the inventive concept.

FIG. 6 is a block diagram illustrating a memory cell array that may be included in a nonvolatile memory device according to an embodiment of the inventive concept.

Referring to FIG. 6, a memory cell array 300b includes a plurality of memory cell blocks 310b and 330b. Each memory cell block 310b and 330b may include a plurality of pages 311b, 312b, 313b and 314b.

One page 311b (e.g., page 0 or a first page 311b) of each memory cell block 310b and 330b may include monitoring cells (MC) 316b. The monitoring cells 316b may be programmed when data cells DC of the first page 311b are programmed.

During a read operation directed to the data cells DC of the first page 311b, monitoring cell data representing whether each of the monitoring cells 316b is an ON-cell or an OFF-cell may be obtained. If a read fail occurs during the read operation for the first page 311b, an optimal read voltage level may be determined according to the number of ON-cells among the monitoring cells 316b based on the monitoring cell data, and the read operation for the first page 311b may be retried using a read voltage having a more optimal read voltage level. Further, the more optimal read voltage level may be applied to other pages 312b, 313b and 314b of a memory cell block 310b including the first page 311b. Thus, if the read fail occurs during a read operation for a second page 312b, a third page 313b or a fourth page 314b, the read operation for the second page 312b, the third page 313b or the fourth page 314b may be retried using the read voltage having the more optimal read voltage level.

As described above, in certain embodiments, one page 311b of each memory cell block 310b and 330b may include the monitoring cells 316b, and the optimal read voltage level determined according to the number of ON-cells (or the number of OFF-cells) among the monitoring cells included in the one page 311b may be applied to all pages 311b, 312b, 313b and 314b of the memory cell block 310b including the one page 311b.

Although FIG. 5 illustrates an example where all pages of each memory cell block include the monitoring cells, and FIG. 6 illustrates an example where one page of each memory cell block include the monitoring cells, other embodiments of the inventive concept may include two or more pages of each memory cell block including monitoring cells.

Figure 7:
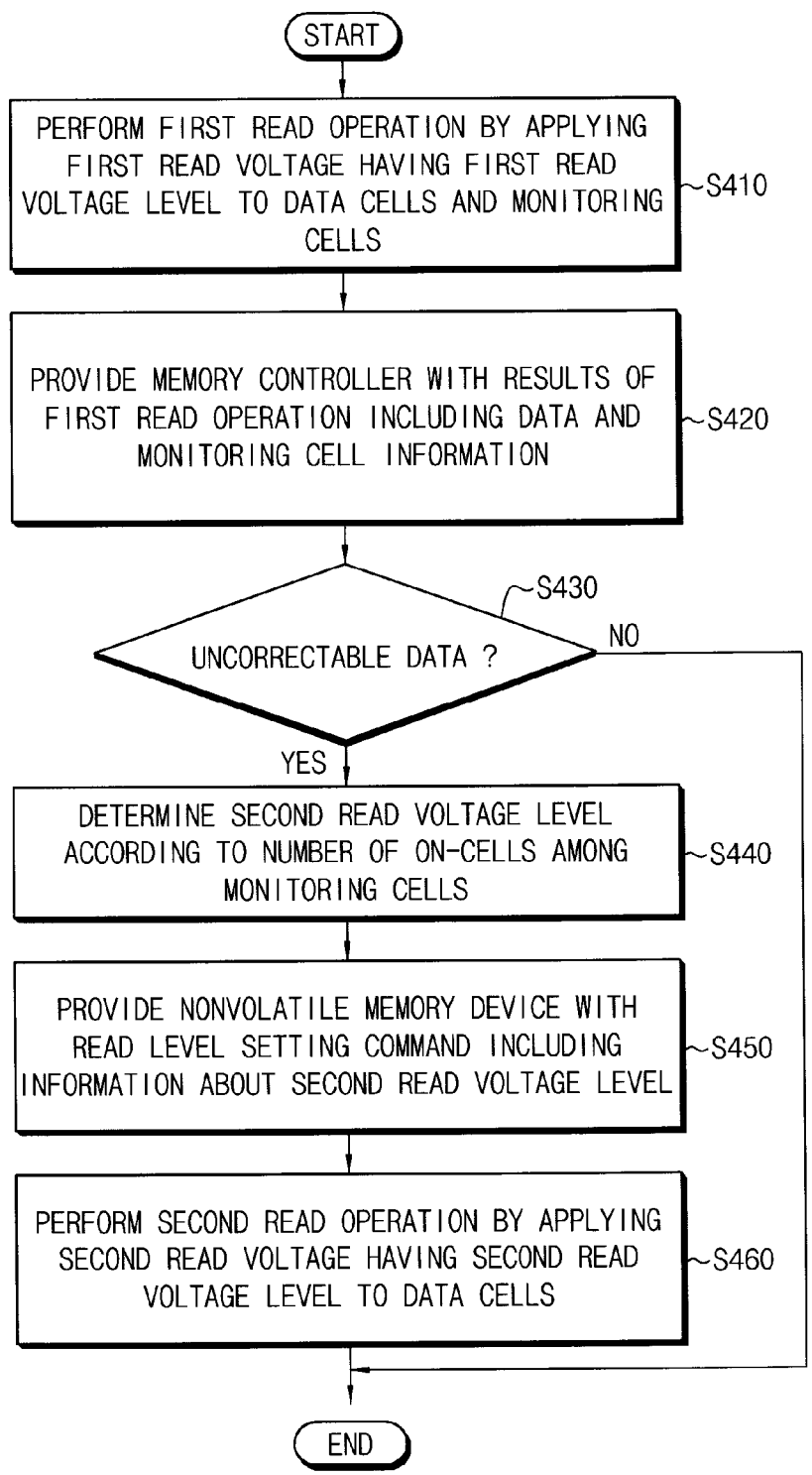
FIG. 7 is a flowchart summarizing a method of reading data in a nonvolatile memory device according to an embodiment of the inventive concept.
Figure 8:
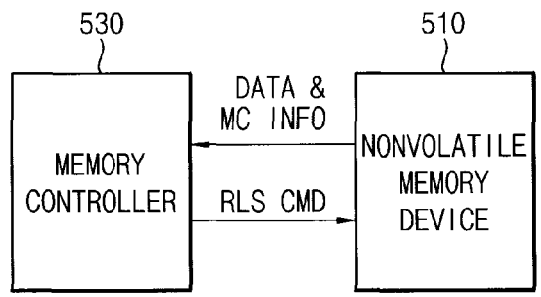
FIG. 8 is a general block diagram illustrating a memory system capable of performing the data read method of FIG. 7 according to an embodiment of the inventive concept.

FIG. 7 is a flow chart summarizing a data read method in a nonvolatile memory device according to an embodiment of the inventive concept. FIG. 8 is a general block diagram of a memory system capable of performing the data read method of FIG. 7.

Referring to FIGS. 7 and 8, a nonvolatile memory device 510 includes data cells programmed to store data DATA and monitoring cells programmed to have different threshold voltages that are evenly distributed at regular intervals across a defined monitoring range. For example, the monitoring cells may be programmed by an ISPP voltage for programming the data DATA into the data cells, and the numbers of applying the ISPP voltage to the monitoring cells may be sequentially increased for the respective monitoring cells such that the monitoring cells are programmed to have the evenly distributed threshold voltages. As before, during a program operation, the threshold voltages of the data cells may be verified, while the threshold voltages of the monitoring cells may not be verified.

The nonvolatile memory device 510 perform a first read operation by applying a first read voltage having a first read voltage level to the data cells and the monitoring cells (S410). Accordingly, as a result of the first read operation, the data DATA may be read from the data cells, and monitoring cell data (or information) MC INFO representing whether each monitoring cell is an ON-cell or an OFF-cell may be read from the monitoring cells. The nonvolatile memory device 510 provides a memory controller 530 with the results of the first read operation including the data DATA read from the data cells and the monitoring cell data MC INFO read from the monitoring cells (S420).

Now, the memory controller 530 may determine whether a read fail has occurred as a result of the first read operation. To detect occurrence of the read fail, the memory controller 530 may, for example, determine whether user data included in the data DATA is uncorrectable using the error correction capabilities of the memory system (S430). If the user data is correctable (S430=NO), the data DATA will include not more bit errors that the error correction capabilities are able to correct. In such circumstances, the read operation may be completed.

However, if the user data is uncorrectable (S430=YES), the memory controller 530 may determine a second read voltage level according to the number of the ON-cells among the monitoring cells based on the monitoring cell data MC INFO (S440). For example, the memory controller 530 may count the number of the ON-cells among the monitoring cells based on the monitoring cell data MC INFO provided from the nonvolatile memory device 510, and may determine the second read voltage level such that an increment/decrement from the first read voltage level to the second read voltage level is in linear inverse proportion to the increment/decrement of the number of the ON-cells.

The memory controller 530 may inform the nonvolatile memory device 510 of the second read voltage level by providing the nonvolatile memory device 510 with a read level setting command RLS CMD including information about the second read voltage level (S450).

The nonvolatile memory device 510 may receive the read level setting command RLS CMD, and may perform a second read operation by applying a second read voltage having the second read voltage level indicated by the read level setting command RLS CMD to the data cells (S460). Since the second read voltage level, or an optimal read voltage level is determined based on the threshold voltage shift of the monitoring cells corresponding to the threshold voltage shift of the data cells, the data read by the second read operation may be exact data.

As described above, in a read data method in the nonvolatile memory device 510 according to an embodiment of the inventive concept, since the memory controller 530 determines a more optimal read voltage level based on the monitoring cell data MC INFO, the data DATA may be more accurately read using what amounts to be a single retry (or by at most two read operations) even when a first read operation results in a read fail. Accordingly, as compared with conventional data read methods, data read methods according to embodiments of the inventive concept enjoy markedly reduced read times.

Figure 9:
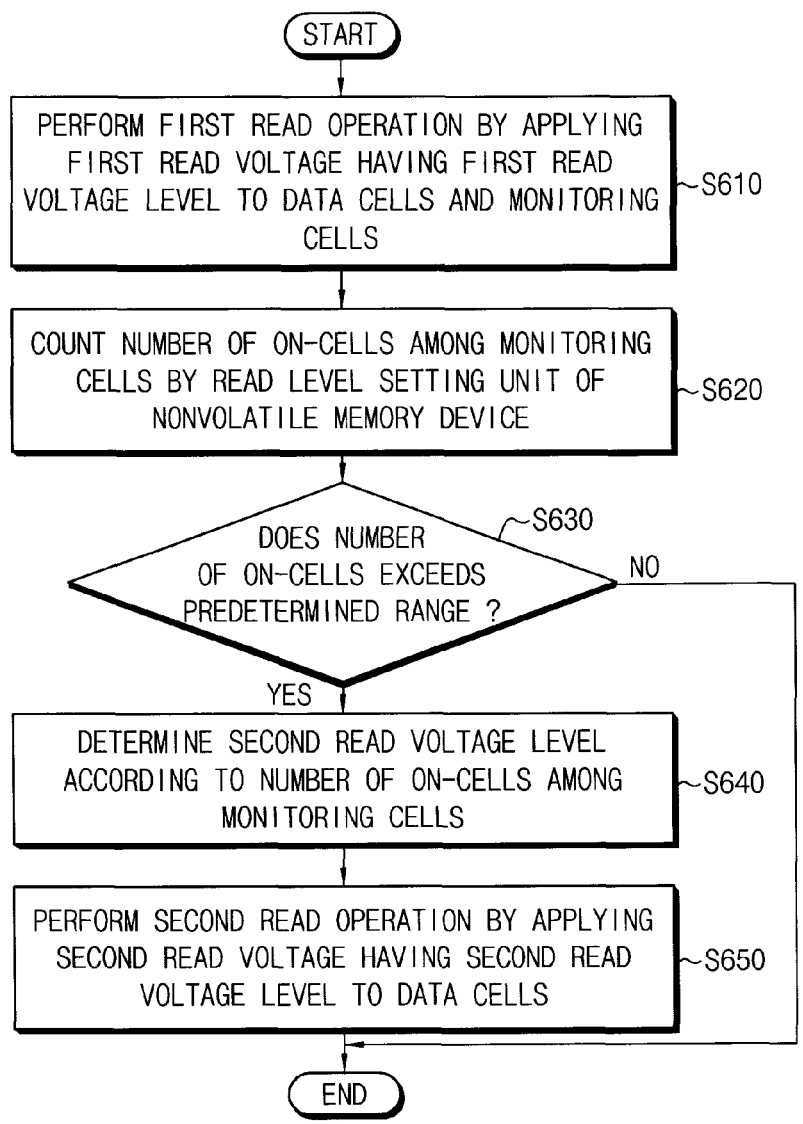
FIG. 9 is a flowchart summarizing a method of data read method in a nonvolatile memory device according to an embodiment of the inventive concept.
Figure 10:
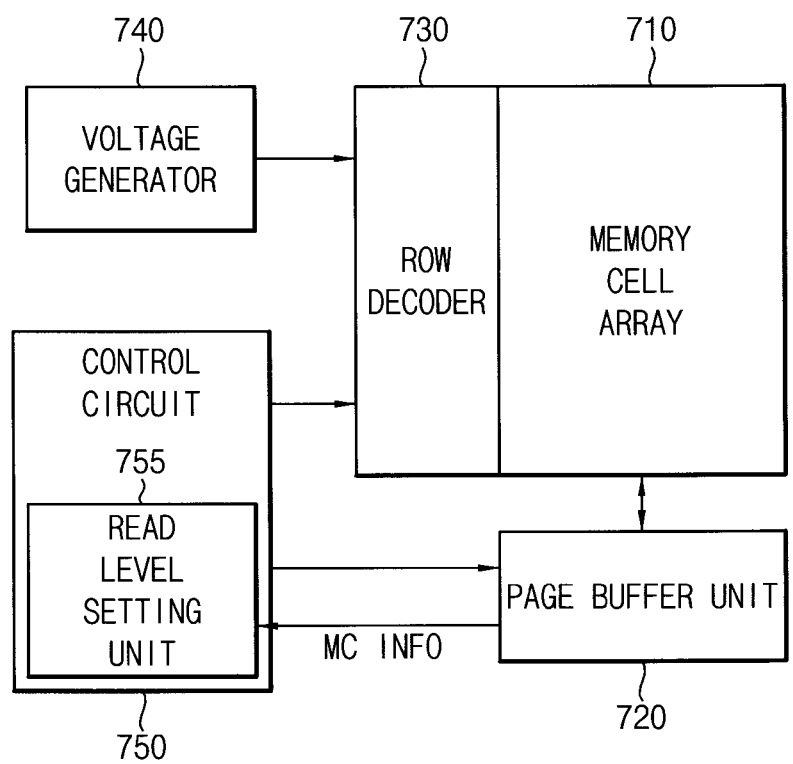
FIG. 10 is a block diagram illustrating a nonvolatile memory device capable of performing the data read method of FIG. 9 according to an embodiment of the inventive concept.

FIG. 9 is a flow chart summarizing a data read method in a nonvolatile memory device according to another embodiment of the inventive concept. FIG. 10 is a block diagram illustrating a nonvolatile memory device capable of performing the data read method of FIG. 9.

Referring to FIG. 10, a nonvolatile memory device 700 includes a memory cell array 710, a page buffer unit 720, a row decoder 730, a voltage generator 740 and a control circuit 750.

The memory cell array 710 includes at least one memory cell block. At least one page of the memory cell array 710 includes monitoring cells. The page buffer unit 720 may operate as write drivers or sense amplifiers according to operational mode. For example, the page buffer unit 720 may operate as the sense amplifiers during a read mode, and may operate as the write drivers during a write mode. The row decoder 730 selects a wordline in response to a row address. The voltage generator 740 is controlled by the control circuit 750 to generate wordline voltages, such as a program voltage, a pass voltage, a verify voltage, a read voltage, etc. The row decoder 730 may be sued to apply the word line voltages from the voltage generator 740 to selected and non-selected word lines. The control circuit 750 may be used to control the page buffer unit 720, the row decoder 730 and the voltage generator 740 during program operations and/or read operations.

The control circuit 750 may include a read level setting unit 755 that determines whether a read fail occurs and determines an optimal read voltage level. The read level setting unit 755 may receive memory cell information MC INFO read from the monitoring cells included in the memory cell array 710 via the page buffer unit 720. To detect occurrence of a read fail, the read level setting unit 755 may determine whether the number of ON-cells among the monitoring cells exceeds a predetermined range based on the memory cell information MC INFO. In response to a read fail, the read level setting unit 755 may determine a more optimal read voltage level according to the number of ON-cells among the monitoring cells based on the memory cell information MC INFO. According to example embodiments, the read level setting unit 755 may be located internal or external to the control circuit 750. For example, the read level setting unit 755 may be located within the page buffer unit 720.

Hereinafter, a data read method in the nonvolatile memory device 700 will be described with reference to FIGS. 9 and 10.

Referring to FIGS. 9 and 10, the nonvolatile memory device 700 performs a first read operation by applying a first read voltage having a first read voltage level to data cells programmed to store data and the monitoring cells programmed to have different threshold voltages that are evenly distributed at regular intervals (S610). According to the results of the first read operation, data may be read from the data cells, and the monitoring cell data MC INFO indicating whether each monitoring cell is an ON-cell or an OFF-cell may be read from the monitoring cells. The monitoring cell data MC INFO may be read from the memory cell array 710 to the page buffer unit 720, and the page buffer unit 720 may provide the monitoring cell data MC INFO to the read level setting unit 755.

The read level setting unit 755 may count the number of the ON-cells having threshold voltage levels lower than the first read voltage level among the monitoring cells based on the monitoring cell data MC INFO (S620). To detect occurrence of a read fail during the first read operation, the read level setting unit 755 may determine whether the number of ON-cells (or the number of off-cells) among the monitoring cells exceeds a predetermined range (S630).

If the number of ON-cells (or the number of off-cells) does not exceed the predetermined range (S630=NO), the read level setting unit 755 will determine that a read fail does not occur, and the nonvolatile memory device 700 may provide a memory controller with the data read by the first read operation. For example, if the number of the ON-cells is neither increased nor decreased as compared with a number of ON-cells expected when no threshold voltage shift is present, or if the number of the ON-cells is increased or decreased by less than a predetermined threshold value, the read level setting unit 755 may decide that the read fail does not occur.

However, if the number of ON-cells (or the number of OFF-cells) exceeds the predetermined range (S630=YES), the read level setting unit 755 may determine a second read voltage level according to the number of the ON-cells among the monitoring cells based on the monitoring cell data MC INFO (S640). For example, the read level setting unit 755 may determine the second read voltage level such that an increment/decrement from the first read voltage level to the second read voltage level may be in linear inverse proportion to an increment/decrement of the number of the ON-cells.

The nonvolatile memory device 700 may perform a second read operation by applying a second read voltage having the second read voltage level determined by the read level setting unit 755 to the data cells (S650). For example, the control circuit 750 may control the voltage generator 740 to generate the second read voltage having the second read voltage level determined by the read level setting unit 755. Since the second read voltage level has a more optimal read voltage level based on the threshold voltage shift of the monitoring cells corresponding to the threshold voltage shift of the data cells, the data read by the second read operation will be accurate, despite the presence of a threshold voltage shift.

As described above, in the method of read data in the nonvolatile memory device 700 according to embodiments of the inventive concept, since the read level setting unit 755 included in the nonvolatile memory device 700 may detect the occurrence of a read fail based on the number of the ON-cells (or the number of the off-cells) among the monitoring cells, and may determine a more optimal read voltage level according to the number of the ON-cells (or the number of the off-cells) among the monitoring cells, the exact data may be read using a single read retry (or at most two read operations) although the read fail occurs. Accordingly, compared with a conventional read method, a data read method in the nonvolatile memory device 700 according to an embodiment of the inventive concept will enjoy reduced read times.

Figure 11:
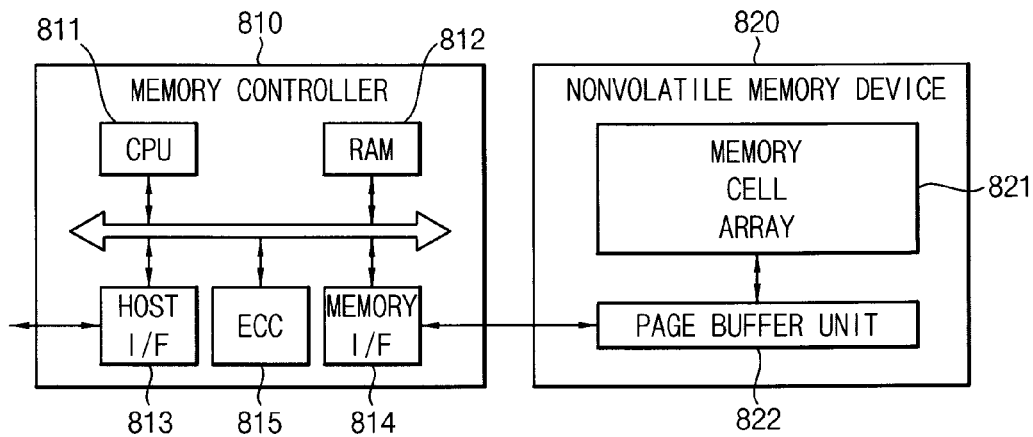
FIG. 11 is a block diagram illustrating a memory system according to an embodiment of the inventive concept.

FIG. 11 is a block diagram illustrating a memory system according to an embodiment of the inventive concept.

Referring to FIG. 11, a memory system 800 includes a memory controller 810 and a nonvolatile memory device 820.

The nonvolatile memory device 820 includes a memory cell array 821 and a page buffer unit 822. The memory cell array 821 may include data cells programmed to store data and monitoring cells programmed to have predetermined threshold voltages. During a first read operation that reads the data from the data cells, monitoring cell data representing whether each monitoring cell is an ON-cell or an OFF-cell may be read from the monitoring cells. If a read fail occurs during the first read operation, the nonvolatile memory device 820 may perform a second read operation by using a read voltage having an optimal read voltage level that is determined according to the number of ON-cells (or the number of OFF-cells) among the monitoring cells. Accordingly, the nonvolatile memory device 820 according to example embodiments may accurately read the data by one read retry although the read fail occurs.

The memory controller 810 may control the nonvolatile memory device 820. The memory controller 810 may control data transfer between an external host (not shown) and the nonvolatile memory device 820. The memory controller 810 may include a central processing unit 811, a buffer memory 812, a host interface 813 and a memory interface 814. The central processing unit 811 may perform operations for the data transfer. The buffer memory 812 may be implemented by a dynamic random access memory (DRAM), a static random access memory (SRAM), a phase random access memory (PRAM), a ferroelectric random access memory (FRAM), a resistive random access memory (RRAM), a magnetic random access memory (MRAM), etc. The buffer memory 812 may be located internal or external to the memory controller 810.

The host interface 813 may be coupled to the host, and the memory interface 814 may be coupled to the nonvolatile memory device 820. The central processing unit 811 may communicate with the host via the host interface 813. For example, the host interface 813 may be configured to communicate with the host using at least one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), etc. Further, the central processing unit 811 may communicate with the nonvolatile memory device 820 via the memory interface 814. In certain embodiments, the memory controller 810 may further include an error correction block 815 for error correction. According to certain embodiments, the memory controller 810 may be built in the nonvolatile memory device 820, or the memory controller 810 and the nonvolatile memory device 820 may be implemented as separate chips.

The memory system 800 may be implemented as a memory card, a solid state drive, etc. In certain embodiments, the nonvolatile memory device 820, the memory controller 810 and/or the memory system 800 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 12:
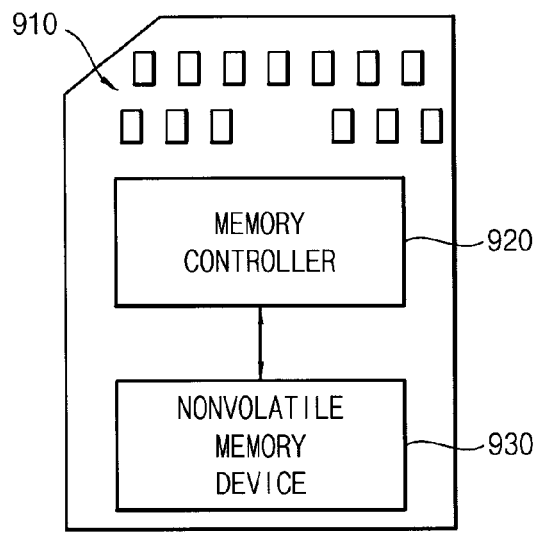
FIG. 12 is a diagram illustrating a memory card including a memory system according to an embodiment of the inventive concept.

FIG. 12 is a diagram illustrating a memory card including a memory system according to an embodiment of the inventive concept.

Referring to FIG. 12, a memory card 900 may include a plurality of connecting pins 910, a memory controller 920 and a nonvolatile memory device 930.

The connecting pins 910 may be coupled to a host (not shown) to transfer signals between the host and the memory card 900. The connecting pins 910 may include a clock pin, a command pin, a data pin and/or a reset pin.

The memory controller 920 may receive data from the host, and may store the received data in the nonvolatile memory device 930.

The nonvolatile memory device 930 may include data cells programmed to store data and monitoring cells programmed to have predetermined threshold voltages. During a first read operation that reads the data from the data cells, monitoring cell data representing whether each monitoring cell is an on-cell or an off-cell may be read from the monitoring cells. If a read fail occurs during the first read operation, the nonvolatile memory device 930 may perform a second read operation by using a read voltage having an optimal read voltage level that is determined according to the number of ON-cells (or the number of OFF-cells) among the monitoring cells. Accordingly, the nonvolatile memory device 930 according to embodiments of the inventive concept may accurately read the data using at most one read retry.

For example, the memory card 900 may include a multi-media card (MMC), an embedded multimedia card (eMMC), a hybrid embedded multimedia card (hybrid eMMC), a secure digital (SD) card, a micro-SD card, a memory stick, an ID card, a personal computer memory card international association (PCMCIA) card, a chip card, a USB card, a smart card, a compact flash (CF) card, etc.

In certain embodiments, the memory card 900 may be coupled to the host, such as a desktop computer, a laptop computer, a tablet computer, a mobile phone, a smart phone, a music player, a personal digital assistants (PDA), a portable multimedia player (PMP), a digital television, a digital camera, a portable game console, etc.

Figure 13:
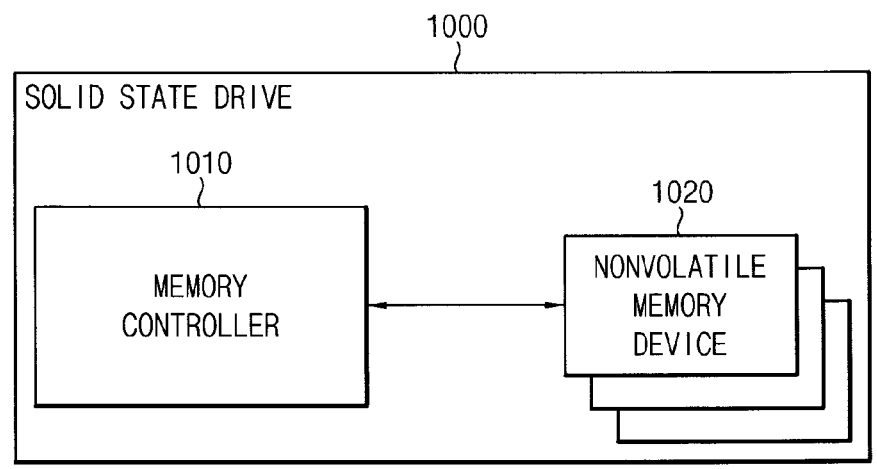
FIG. 13 is a diagram illustrating a solid state drive including a memory system according to an embodiment of the inventive concept.

FIG. 13 is a diagram illustrating a solid state drive (SSD) including a memory system according to an embodiment of the inventive concept.

Referring to FIG. 13, a solid state drive (SSD) 1000 includes a memory controller 1810 and a plurality of nonvolatile memory devices 1820.

The memory controller 1010 may receive data from a host (not shown). The memory controller 1010 may store the received data in the plurality of nonvolatile memory devices 1020.

Each nonvolatile memory device 1020 may include data cells programmed to store data and monitoring cells programmed to have predetermined threshold voltages. During a first read operation that reads the data from the data cells, monitoring cell data representing whether each monitoring cell is an ON-cell or an OFF-cell may be read from the monitoring cells. If a read fail occurs during the first read operation, the nonvolatile memory device 1020 may perform a second read operation by using a read voltage having an optimal read voltage level that is determined according to the number of ON-cells (or the number of OFF-cells) among the monitoring cells. Accordingly, the nonvolatile memory device 1020 according to an embodiment of the inventive concept may accurately read data using at most one read retry.

In certain embodiments, the SSD 1000 may be coupled to the host, such as a mobile device, a mobile phone, a smart phone, a PDA, a PMP, a digital camera, a portable game console, a music player, a desktop computer, a notebook computer, a tablet computer, a speaker, a video, a digital television, etc.

Figure 14:
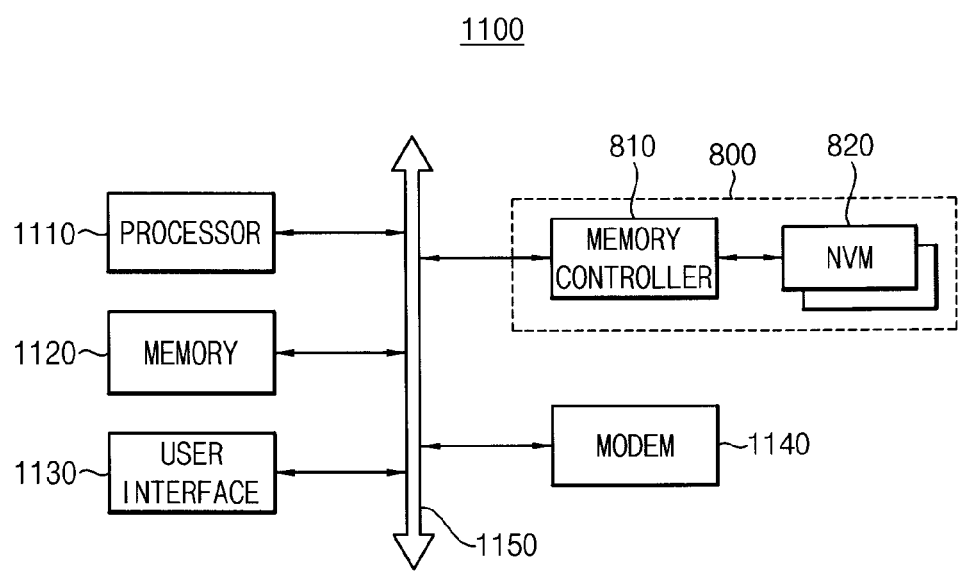
FIG. 14 is a diagram illustrating a computational system according to an embodiment of the inventive concept.

FIG. 14 is a diagram illustrating a computational system according to an embodiment of the inventive concept.

Referring to FIG. 14, a computational system 1100 includes a processor 1110, a memory device 1120, a user interface 1130 and a memory system 1100. In certain embodiments, the computational system 1100 may further include a modem 1140, such as a baseband chipset.

The processor 1110 may perform specific calculations or tasks. For example, the processor 1110 may be a microprocessor, a central processing unit (CPU), a digital signal processor, or the like. The processor 1110 may be coupled to the memory device 1120 via a bus 1150, such as an address bus, a control bus and/or a data bus. For example, the memory device 1120 may be implemented by a DRAM, a mobile DRAM, a SRAM, a PRAM, a FRAM, a RRAM, a MRAM and/or a flash memory. Further, the processor 1110 may be coupled to an extension bus, such as a peripheral component interconnect (PCI) bus, and may control the user interface 1130 including at least one input device, such as a keyboard, a mouse, a touch screen, etc., and at least one output device, a printer, a display device, etc. The modem 1140 may perform wired or wireless communication with an external device. The nonvolatile memory device 820 may be controlled by a memory controller 810 to store data processed by the processor 1110 or data received via the modem 1140. In certain embodiments, the computational system 1100 may further include a power supply, an application chipset, a camera image processor (CIS), etc.

Certain embodiments of the inventive concept may be applied to any nonvolatile memory device, and devices and systems including nonvolatile memory device(s). For example, one or more embodiments of the inventive concept may be applied to various electronic devices, such as a memory card, a solid state drive, a desktop computer, a laptop computer, a tablet computer, a mobile phone, a smart phone, a music player, a PDA, a PMP, a digital television, a digital camera, a portable game console, etc.

The foregoing embodiments are illustrative in nature. Those skilled in the art will readily appreciate that many modifications are possible in the illustrated embodiments without materially departing from the novel teachings and advantages of the inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A data read method in a nonvolatile memory device including data cells and monitoring cells, the method comprising:
    performing a first read operation by applying a first read voltage having a first read voltage level to the data cells and the monitoring cells, wherein the data cells have been programmed to store data according to a plurality of data state threshold voltage distributions, and the monitoring cells have been programmed to a plurality of predetermined threshold voltages;
    determining whether a read fail occurs as a result of the first read operation;
    if the read fail occurs as the result of the first read operation, determining a second read voltage having a second read voltage level determined by adjusting the first read voltage level according to at least one of a number of ON-cells and a number of OFF-cells among the monitoring cells; and then,
    performing a second read operation by applying the second read voltage to the data cells.

2. The method of claim 1, wherein the plurality of predetermined threshold voltages is evenly distributed at regular intervals across a monitoring range of threshold voltages.

3. The method of claim 1, wherein the second read voltage level is determined in linear inverse proportion to the at least one of a number of ON-cells and a number of OFF-cells among the monitoring cells.

4. The method of claim 1, wherein each one of the plurality of predetermined threshold voltages is defined by a number of applications of a program voltage to at least one of the plurality of monitoring cells.

5. The method of claim 4, wherein the program voltage is an incremental step pulse program (ISSP) voltage applied to plurality of monitoring cells during a program operation.

6. The method of claim 5, wherein each one of the monitoring cells is uniquely programmed to one of the plurality of predetermined threshold voltages using a different number of applications of the ISSP voltage.

7. The method of claim 5, wherein the plurality of predetermined threshold voltages is evenly distributed by a voltage increment corresponding to a step increment for the ISSP voltage.

8. The method of claim 5, wherein the program operation verifies only programmed threshold voltage distributions for the data cells.

9. The method of claim 1, wherein determining whether the read fail occurs as the result of the first read operation comprises determining whether or not first read data retrieved from the data cells by the first read operation is correctable, and only if the first read data is determined to be uncorrectable, determining the second read voltage and performing the second read operation.

10. The method of claim 1, wherein determining whether the read fail occurs as the result of the first read operation comprises determining by operation of nonvolatile memory device, at least one of the number of ON-cells and the number of OFF-cells among the monitoring cells exceeds a predetermined range.

11. The method of claim 10, wherein the second read voltage level is determined by a read level setting unit in the nonvolatile memory device.

12. The method of claim 1, wherein the data cells and the monitoring cells are commonly coupled to a same word line.

13. The method of claim 12, wherein the nonvolatile memory device stores data according to a plurality of memory blocks and at least one page in each one of the plurality of memory blocks includes the monitoring cells.

14. The method of claim 12, wherein the nonvolatile memory device stores data according to a plurality of memory blocks, each memory block including a plurality of pages, and each page in the plurality of pages of each one of the plurality of memory blocks includes the monitoring cells.

15. A method of operating a memory system providing error correction capabilities and including a memory controller that controls a nonvolatile memory device, the nonvolatile memory device including data cells and monitoring cells, the method comprising:
  during a program operation and using a same program voltage, programming the data cells according to a plurality of data state threshold voltage distributions and programming the monitoring cells according to a plurality of predetermined threshold voltages different from the plurality of data state threshold voltage distributions; and then,
  performing a first read operation using a first read voltage having a first read voltage level to obtain read data detected in accordance with the plurality of data state threshold voltage distributions from the data cells, and to obtain monitoring data from the monitoring cells in accordance with the plurality of predetermined threshold voltages, wherein the monitoring data indicates in relation to the first read voltage at least one of a number of ON-cells and a number of OFF-cells among the monitoring cells;
  determining according to the error correction capabilities of the memory system whether or not the read data is correctable; and
  only if the read data is not correctable, performing a second read operation using a second read voltage having a second read voltage level that varies from the first read voltage level according to the monitoring data.

16. The method of claim 15, wherein the second read voltage level varies from the first read voltage level in linear inverse proportion to the at least one of a number of ON-cells and a number of OFF-cells among the monitoring cells.

17. The method of claim 15, wherein the program voltage is an incremental step pulse program (ISSP) voltage, and each one of the monitoring cells is uniquely programmed to one of the plurality of predetermined threshold voltages using a different number of applications of the ISSP voltage, such that the plurality of predetermined threshold voltages is evenly distributed by a voltage increment corresponding to a step increment for the ISSP voltage.

18. The method of claim 15, wherein the data cells and the monitoring cells are commonly coupled to a same word line, the nonvolatile memory device stores data according to a plurality of memory blocks, and at least one page in each one of the plurality of memory blocks includes the monitoring cells.

19. The method of claim 15, the data cells and the monitoring cells are commonly coupled to a same word line, the nonvolatile memory device stores data according to a plurality of memory blocks, each memory block including a plurality of pages, and each page in the plurality of pages of each one of the plurality of memory blocks includes the monitoring cells.

20. A data read method in a nonvolatile memory device including data cells and monitoring cells, the data read method consisting of:
  performing a first read operation by applying a first read voltage having a first read voltage level to the data cells and the monitoring cells, the data cells having been programmed according to a plurality of data state threshold voltage distributions, and the monitoring cells having been programmed according to a plurality of predetermined threshold voltages different from the plurality of data state threshold voltage distributions;
  if a read fail occurs as a result of the first read operation, determining a second read voltage having a second read voltage level determined by adjusting the first read voltage level according to at least one of a number of ON-cells and a number of OFF-cells among the monitoring cells; and then,
  performing a second read operation using the second read voltage to the data cells.

* * * * *